United States Patent [19]
Appelt et al.

[11] Patent Number: 5,866,203
[45] Date of Patent: *Feb. 2, 1999

[54] TECHNIQUE FOR FORMING RESIN-IMPREGNATED FIBERGLASS SHEETS USING MULTIPLE RESINS

[75] Inventors: Bernd Karl Appelt, Apalachin; Robert Maynard Japp, Vestal; Kostantinos Papathomas, Endicott; William John Rudik, Vestal, all of N.Y.

[73] Assignee: International Business Machines Corporation, Armonk, N.Y.

[*] Notice: The term of this patent shall not extend beyond the expiration date of Pat. No. 5,783,252.

[21] Appl. No.: 890,527

[22] Filed: Jul. 9, 1997

Related U.S. Application Data

[62] Division of Ser. No. 716,813, Sep. 10, 1996, Pat. No. 5,780,366.

[51] Int. Cl.⁶ .............................. B32B 31/08; B32B 7/00
[52] U.S. Cl. ......................... 427/217; 427/379; 427/381; 427/386; 427/389.7; 427/402; 427/407.3; 427/258; 427/331; 427/214
[58] Field of Search .................................. 427/381, 379, 427/386, 389.7, 402, 407.3, 258, 331, 2.4, 2.7; 428/901, 356; 442/62, 64, 66, 71, 144

[56] References Cited

U.S. PATENT DOCUMENTS

| | | |
|---|---|---|
| 3,698,940 | 10/1972 | Mersereau et al. . |
| 3,972,765 | 8/1976 | Kondo et al. . |
| 4,024,305 | 5/1977 | Alpaugh et al. . |
| 4,456,712 | 6/1984 | Christie et al. . |
| 4,675,235 | 6/1987 | Wu . |
| 4,804,427 | 2/1989 | Paul et al. . |
| 4,954,200 | 9/1990 | Trewiler . |
| 5,071,701 | 12/1991 | Tenney et al. . |
| 5,104,698 | 4/1992 | Hayashi et al. . |
| 5,137,756 | 8/1992 | Harada . |
| 5,266,139 | 11/1993 | Yokota et al. . |
| 5,273,816 | 12/1993 | Olson et al. . |
| 5,470,647 | 11/1995 | Zimics et al. . |
| 5,492,722 | 2/1996 | Tait et al. . |
| 5,541,000 | 7/1996 | Hardy et al. . |
| 5,554,667 | 9/1996 | Smith et al. . |

FOREIGN PATENT DOCUMENTS

| | | |
|---|---|---|
| 58-187434 | 11/1983 | Japan . |
| 59-024625 | 2/1984 | Japan . |
| 60-198236 | 7/1985 | Japan . |
| 63-048340 | 8/1986 | Japan . |
| 63-159441 | 7/1988 | Japan . |
| 63-159442 | 7/1988 | Japan . |
| 2-244-786 | 9/1990 | Japan . |
| 4-201304 | 7/1992 | Japan . |

OTHER PUBLICATIONS

"Prepreg Manufacturing Process," F.W. Haining and D.G. Herbaugh, IBM Technical Disclosure Bulletin, vol. 20, No. 11B, Apr., 1978 B, p. 4723.

*Primary Examiner*—Richard Weisberger
*Attorney, Agent, or Firm*—Calfee, Halter & Griswold LLP

[57] ABSTRACT

A method and resultant article are provided which optimize the adhesion of resin to the glass fibers in fiberglass cloth impregnated with a resin and also optimize the adhesion of the impregnated resin to metal sheets laminated to the resin-impregnated cloth. The fiberglass is treated in two or more passes. On the first pass, the fiberglass is impregnated with a first resin which is optimized for adherence to glass fibers and the coated resin is partially cured. In a last pass, the fiberglass is impregnated with a second resin, which is different from said first resin, and is optimized for bonding to metal. The second resin is then partially cured. The first and second resins are selected such that they form a bond with each other when cured.

2 Claims, 2 Drawing Sheets

U.S. Patent    Feb. 2, 1999    Sheet 1 of 2    5,866,203

TECHNIQUE FOR FORMING RESIN-IMPREGNATED FIBERGLASS SHEETS USING MULTIPLE RESINS

This is a divisional of application Ser. No. 08/716,813, filed on Sep. 10, 1996 now U.S. Pat. No. 5,780,366.

RELATED APPLICATIONS

Application Ser. No. 28/716,814, filed Sep. 10, 1996, for "Technique for Forming Resin-Impregnated Fiberglass Sheets" (Atty. Docket No. EN9-96-028).

Application Ser. No. 28/716,815, filed Sep. 10, 1996, for "Technique for Forming Resin-Impregnated Fiberglass Sheets with Improved Resistance to Pinholing" (Atty. Docket No. EN9-96-029).

FIELD OF THE INVENTION

This invention relates generally to forming of resin-impregnated cloth, and more particularly to forming improved resin-impregnated fiberglass sheets and the resultant sheets which are specially adapted for use in forming chip carriers and the like, and which use resins which have improved adhesion to both glass fibers and metals in a laminate structure.

BACKGROUND OF THE INVENTION

Resin-impregnated fiberglass sheets are commonly used in the formation of printed circuit boards. The fiberglass cloth is typically impregnated with the selected thermoset resin which is then partially cured and the impregnated cloth sheared to form what are known as sticker or prepreg sheets. In order to enhance the adhesion of the resin to the fiberglass, often a coupling agent, such as a silane, is coated onto the surface of the fiberglass prior to impregnation. The prepreg sheets are then laid up with sheets of metal such as copper or copper-invar-copper (CIC) and laminated with heat and pressure to fully cure the laid-up laminate with the metal sheets defining ground, power and signal planes. One of the desirable characteristics of the resin-impregnated fiberglass sheets is that the resin-impregnation must cover the fibers of the fiberglass and must be able to be partially cured to a non-tacky state wherein the sheets can be handled for the lamination process. This is often referred to as a B-stage, a cure state which allows the sheets to be sufficiently self-supporting to be laid up as a laminate, but not advanced enough in the state of cure that they are rigid or non-flowable when heated, and they can be further cured to a final cure with heat and pressure to form a laminate structure as is well known in the art. As indicated above, this lamination process normally includes the lamination of one or more sheets of metal, such as copper, CIC or other metal, to provide necessary ground planes, power planes and signal planes buried within the laminated circuit board. Also in conventional practice, openings are formed, either by drilling or other means, through the fully cured laminates which form the openings for vias or plated through holes where the connections can be made from one surface of the circuit board to the other and to the various internal planes within the laminate as required.

A conventional technique of forming the resin-impregnated fiberglass sheets is to provide a coil of the fiberglass material and unwind the fiberglass material from the coil and continuously pass it through a tank containing the solution of the desired resin in a solvent, and then pass the coated or impregnated material through a treater tower wherein heat is applied to drive off the solvent and to partially cure the resin material by initiating cross-linking and then coiling the partially-cured or B staged material into a coil. Thereafter, the partially-cured material is uncoiled and cut into sheets of the desired length. These sheets, known as prepreg sheets, are then used in the lamination process described above.

This prepreg material has long been used for manufacturing circuit boards, however, more recently, the same prepreg material and same laminating techniques that have been used to form a circuit board have been used to form chip carriers. A chip carrier is basically a small-size version of a circuit board where the metallurgy and the lay out can be much finer than on a circuit board. Printed circuit board reliability tests are defined, e.g., in IPC specifications, whereas chip carrier tests are defined by JEDEC specifications which are derived for ceramic carriers and are more severe tests. In addition, because of the finer geometry of the metallurgy and the lay-out, chip carriers are more prone to failure from various failure mechanisms.

In forming laminate structures which include resin impregnated glass fibers and metal sheets, such as copper, in the laminate, it is known that certain resins adhere better to the glass fibers, and certain resins adhere better to the metal. Thus, there has been a trade-off as to whether to select a resin for good adhesion to the glass fibers to minimize defects that can occur because of poor adhesion to glass fibers, or to select a resin which has better adhesion to the metal and thus reduce the defects of a laminate structure caused by delamination of the metal from the resin-impregnated fiberglass. Indeed, in some instances, a compromise is attempted by mixing two resins, one having better adhesion to glass fibers and the other having better adhesion to metal. This results in a compromise in that neither the adhesion to the glass fiber nor the adhesion to the metal is optimized; and, moreover, this can cause problems by requiring the selection of resins that are compatible with each other and which can be mixed and will coat properly. Even when these problems are overcome, there is still the problem that neither the adhesion to the fiberglass nor the adhesion to the metal is optimized.

Therefore, it is a principal object of the present invention to provide a resin configuration that optimizes adhesion to both the glass fibers and the metal in a laminate.

SUMMARY OF THE INVENTION

According to the present invention, a method and resultant article are provided which optimize the adhesion of resin to the glass fibers in fiberglass cloth impregnated with a resin and also optimize the adhesion of the impregnated resin to metal sheets laminated to the resin-impregnated cloth.

The fiberglass is treated in two or more passes. On the first pass, the fiberglass is impregnated with a first resin which is optimized for adherence to glass fibers and the coated resin is partially cured. In a last pass, the fiberglass is impregnated with a second resin, which is different from said first resin, and is optimized for bonding to metal. The second resin is then partially cured. The first and second resins are selected such that they form a bond with each other when cured.

DESCRIPTION OF THE PREFERRED EMBODIMENT(S)

Figure 1:
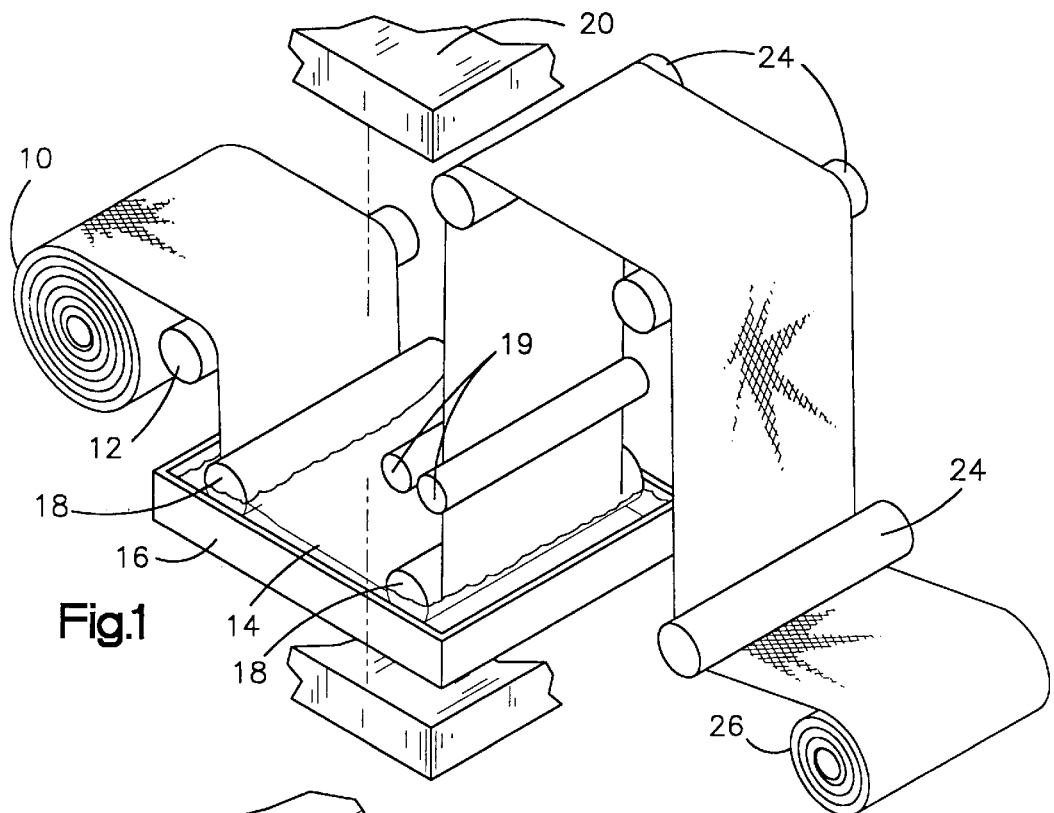
FIG. 1 is a somewhat schematic representation of an apparatus for impregnating fiberglass cloth with resin and partially curing the impregnated fiberglass.

Referring now to the drawings, and for the present to FIG. 1, a somewhat schematic representation of coating of the fiberglass cloth with resin/solvent solution and partially curing the resin is shown. A roll of fiberglass cloth 10 is shown which passes over a guide roll 12 into a solution 14 of the desired resin maintained in a selected solvent. (It is to be understood that the term "solution" is used here to describe the resin in a solvent, whether or not it be a true solution.) The solution 14 is maintained in a tank 16, and the fiberglass cloth from the roll 10 is maintained submerged in the tank by a pair of sink rolls 18. The fiberglass from the roll of fiberglass cloth 10 is passed through the solution 14 into a treater tower 20. The solution impregnates the fiberglass cloth 10 with the resin/solvent solution. The amount of resin on the cloth is usually controlled by metering rolls 19.

The treater tower 20 has a series of rolls 24 over which the fiberglass cloth 10 is reeved, and the treater tower 20 is heated, either by convection or by radiation, such as infrared radiation or by microwave (not shown), or by some other mechanism to drive the solvent from the solution and to partially cure the resin by initiating the cross-linking. The tower 20 is divided into several zones in which the temperature and the gas flow can be controlled independently. The exiting material, known as prepreg, now is comprised of glass cloth and partially reacted resin and is largely free of solvent. This state of the material is known as a B-stage, and the amount of curing required for the B-stage is well known in the art. Specifically, this B-staged resin is sufficiently cured to form a sheet of material which has the resin in such a form that it will remain in the fiberglass material and is sufficiently uncured that it can bond to other similar sheets of material and to metal sheets and be further cured to a hardened state upon application of heat and pressure. The amount of resin applied to the sheet is a function of the nature of the fiberglass cloth 10, as well as the speed of the travel of the fiberglass cloth 10, setting of the metering rolls 19, the composition of the solution of resin and solvent 14, and various physical parameters such as the temperature, viscosity and other well known factors of the solution. Likewise, the amount of cure is a function of the temperature of the tower, the amount of solution and resin applied to the fiberglass cloth, the composition of the solution and the composition of the resin, all of which also are well known in the art. The fiberglass cloth 10 as it emerges from the treater tower 20 in the B-stage state is wound into a coil of partially-cured material 26.

In conventional practice, a single pass of the fiberglass cloth 10 through the solution 14 and the treater tower 20 is used. The partially-cured fiberglass is then ready to be uncoiled and cut into sheets often referred to as prepreg sheets for forming a laminated structure.

Figure 2A:
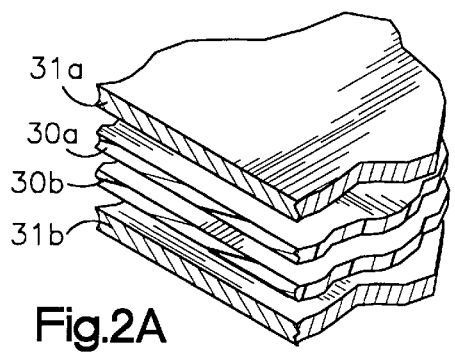
FIG. 2A is a very schematic representation of sheets of partially-cured impregnated resin and copper sheets positioned to form a laminate core structure.
Figure 2B:
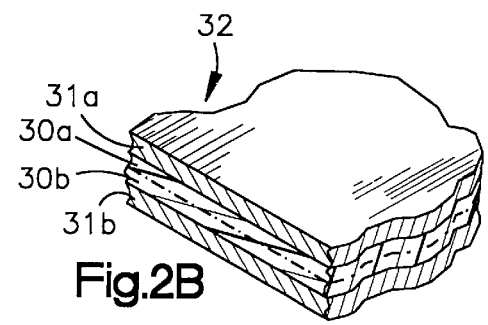
FIG. 2B is a schematic representation view of a portion of a raw core formed from sticker sheets and copper sheets.

In order to form a chip carrier or a circuit board, alternate layers of B-stage cured prepreg sheets and sheets of conductive material such as copper or copper-invar-copper (CIC) as shown in FIG. 2A are laminated together. In one typical lamination process, one or more, and conventionally two, sheets of prepreg 30a, 30b are laminated between two sheets of copper or CIC 31a, 31b using heat and pressure to form a raw core 32 (FIG. 2B). Because of the heat and pressure, the two sheets of prepreg 30a, 30b bond together to form an essentially continuous or single layer, and bond to the two sheets of CIC 31a and 31b. The sheets of prepreg 30a, 30b are essentially fully cured as shown in FIG. 2B with a dotted line indicating their interface.

This raw core can, in the simplest embodiment, be circuitized to form a chip carrier or circuit board. Using photolithographic and drilling techniques, the sheets 31a and 31b are circuitized to form the desired circuitry on both sides of the prepreg sheets 30a and 30b and plated through holes formed where needed.

Figure 2C:
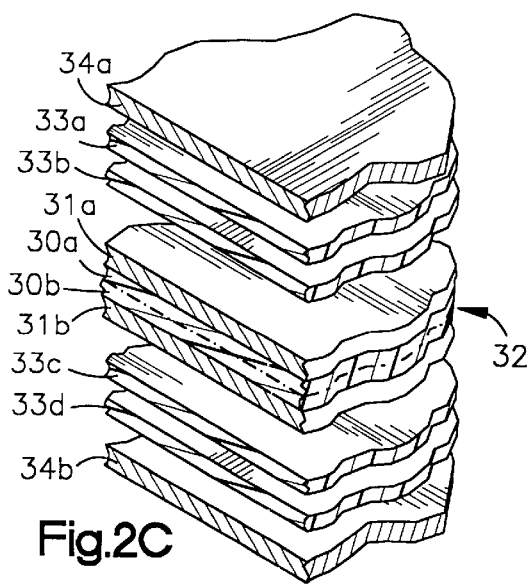
FIG. 2C is a schematic representation of a raw core and sticker sheets and copper sheets positioned to be laminated and form a chip carrier.
Figure 2D:
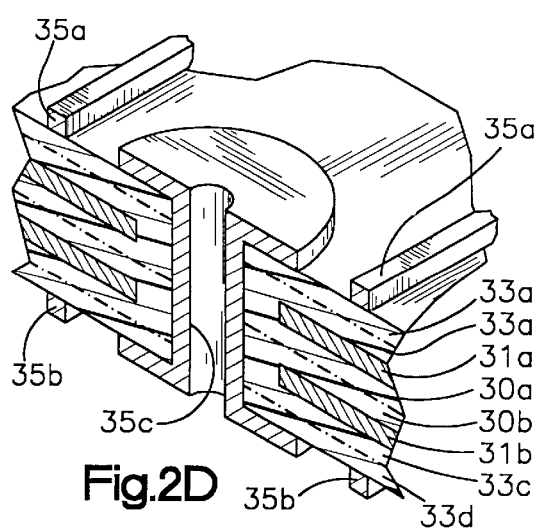
FIG. 2D is a schematic representation of a chip carrier.

In other embodiments, the core 32 is used to form buried planes such as ground planes and power planes, or even signal planes. As shown in FIG. 2C, two additional sheets of prepreg 33a and 33b are laminated to sheet 31a and to a sheet of copper 34a and two additional sheets of prepreg 33c and 33d are laminated to sheet 31b and sheet of copper 34b and essentially fully cured by heat and pressure. These sheets, ready for lamination, are shown in FIG. 2C. Copper sheets 34a and 34b are used to form circuit traces 35a and 35b by subtractive etching. Plated through holes 35c are formed in a conventional manner as shown in FIG. 2D. These raw cores and completed circuit boards or chip carriers are well known in the art as are the various techniques for forming them, and thus they are only briefly described.

As described above, when a resin is chosen for impregnation, it is either optimized for adhesion to glass fibers or optimized for adhesion to metal, or, in some instances as indicated, mixtures of resins can be used which will provide a compromise in which the resin is not optimized for either but is somewhere in between.

According to the present invention, a resin system is provided wherein resins are applied in a multiple pass process which in its simplest form is a two pass process. in the first pass, the fiberglass is impregnated with a resin which is optimized for adhesion to glass fibers and partially cured. The amount of resin impregnated is less than the total loading that is to be the final desired amount. This is shown schematically in FIGS. 3–6.

Figure 3:
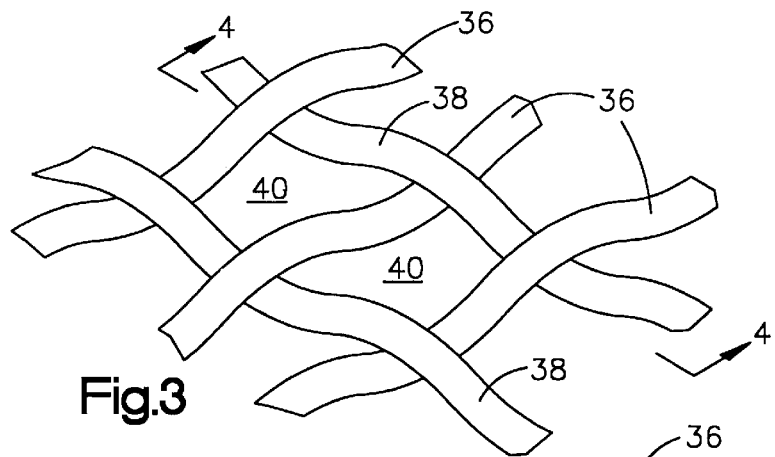
FIG. 3 is a view on an enlarged scale of the portion of woven fiberglass cloth before coating according to this invention.
Figure 4:
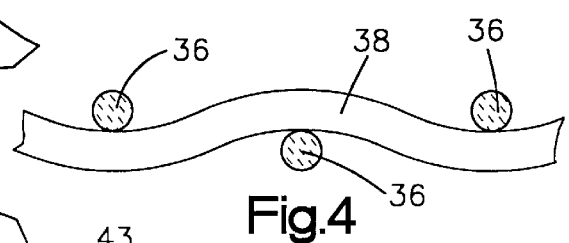
FIG. 4 is a sectional view taken substantially along the plane designated by the line 4—4 of FIG. 3.
Figure 5:
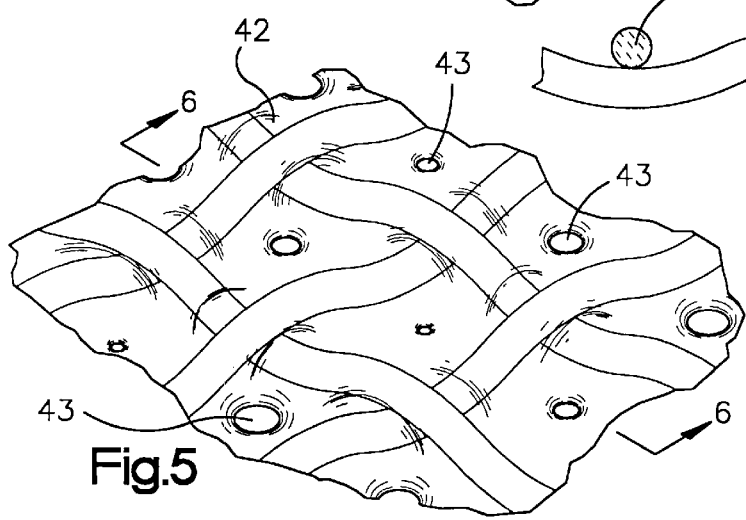
FIG. 5 is a view similar to FIG. 3 after the initial coating of the fiberglass cloth with a resin and partially cured according to this invention.
Figure 6:
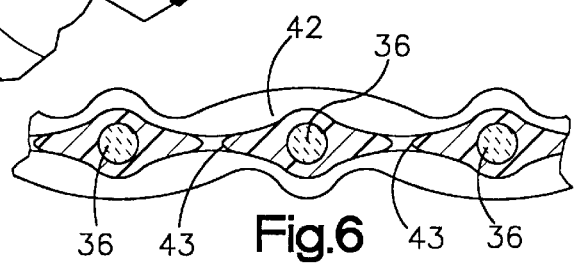
FIG. 6 is a sectional view taken substantially along the plane designed by line 6—6 of FIG. 5.

FIGS. 3 and 4 show a small section of woven fiberglass cloth before coating. The cloth has woof fibers 36 and warp fibers 38 which are woven in a conventional manner to form interstices or windows 40. The glass may have adhesion-promoting coating such as a silane (not shown) coated thereon prior to impregnation. After the first pass and partial cure, the resin material forms a coating 42 of partially-cured resin over the fibers 36 and 38 and, in some instances, bridging over the interstices or windows 40. It is not critical to have significant and substantial coverage of all the windows during this first pass, although substantial coverage of the windows may occur. The only critical requirement is that the glass fibers be covered with resin during the first pass which is optimized for adhesion to the fiberglass. Resins containing bismaleimide triazine (BT) are well suited for adhesion to glass fibers. Significant pin holes 43, as shown in FIGS. 5 and 6, can be present without detrimental effect. The resin must be sufficiently cured during the first pass that it will not redissolve in the resin solution of the second pass.

Figure 7:
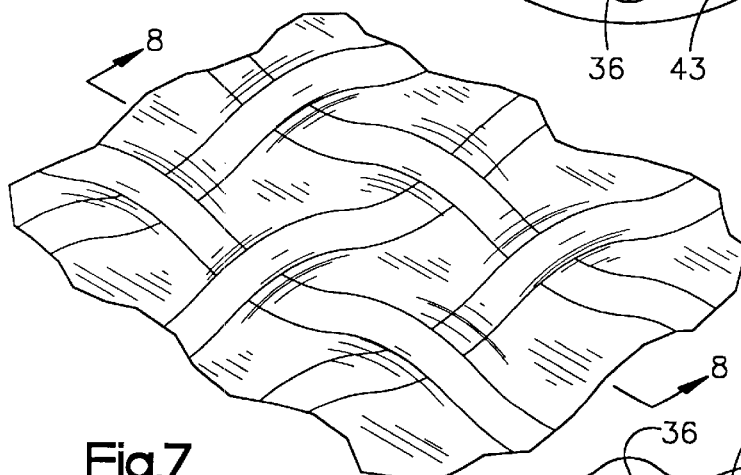
FIG. 7 ia a view similar to FIGS. 3 and 5 after a second coating of resin has been placed over the first coating of the fiberglass cloth.
Figure 8:
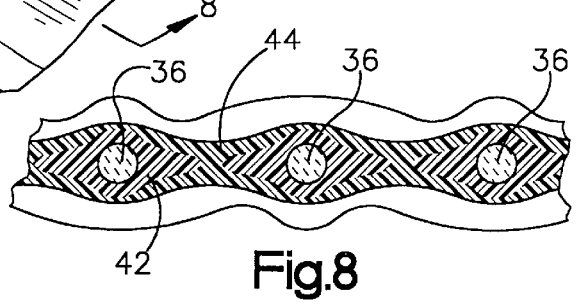
FIG. 8 is a sectional view taken substantially along the plane designated by the line 8—8 of FIG. 7.

The fiberglass, coated and partially cured in the first pass, is left in coil form and is then given a second pass through a solution 14 of a resin. However, the resin in the second solution is selected to optimize adhesion to metal. Of course, the resin of the second solution must also adhere to and bond with the partially cured resin coating 42 and not cause it to dissolve in the solvent/resin solution of the second pass. The resin solution during the second pass coats over the entire coating 42 to form an outer or second coating 44. Since the fiberglass cloth on the second pass also passes through the treater tower 20, the outer coating is partially cured to a B-stage cure, while the heat advances the cure of the inner coating 42, but which coating 42 is not fully cured. The second coating 44 forms a bond with the coating 42 during the partial cure. This condition is shown in FIGS. 7 and 8. The interface between the coating 42 and coating 44 must be a strong bond to prevent delamination and, by the proper selection of resins, this strong bonding can be accomplished. Epoxy resins provide a good interface to copper and other metals, and therefore an epoxy resin is a good selection for the second coating.

It should be understood that the second coating procedure could be performed on a second coating line in a continuous manner following the emergence of the partially cured cloth from the treater tower 20 after the first coating, thus obviating the necessity of coiling and recoating in the same line.

After the second coating process wherein the outer coating 44 is applied and partially cured, the sheets are then cut and are laminated in a conventional manner as previously described for raw cores and/or chip carriers and/or circuit boards. Further heating during the lamination process finishes the bonding process of the outer coating 44 to the inner coating 42, making a strong adherent structure.

The following Table I is an example of a procedure and parameters using particular resin systems in each pass to form a roll of epoxy fiberglass impregnated utilizing two passes with two different resins according to the present invention.

TABLE

GRADE 1080 FIBERGLASS CLOTH[1]

|  | Single Pass | Two Passes | |
|---|---|---|---|
|  | Prior Art | First Pass | Second Pass |
| Treated Weight[2] | 9.9 | 5.5 | 9.9 |
| Resin Content | 59.6[3a] | 27.0[3b] | 59.6[3c] |
| Flow[4] | 25–30 | N/A | 20–25 |
| % Fully Cured[5] | 25–45 | 60–70 | mixed |
| Line Speed[6] M/Min. | 9–13 | 2–4 | 9–13 |
| Resin SpG.[7] Gr/CC | 1.1 | 1.1 | 1.1 |
| Resin Solids[8] | 65% | 65% | 65% |

TABLE-continued

GRADE 1080 FIBERGLASS CLOTH[1]

|  | Single Pass | Two Passes | |
|---|---|---|---|
|  | Prior Art | First Pass | Second Pass |
| Catalyst Level[9] (PHR) | 0.13 | 0.03 | 0.13 |
| Meter Roll Gap.[10] (um) | 180–230 | 180–230 | 180–230 |
| Meter Roll Speed[11] (M/Min) | 2.5 | 2.5 | 2.5 |
| Oven temps[12]: |  |  |  |
| Zone #1 (°C.) | 110 | 110 | 110 |
| Zone #2 (°C.) | 115 | 145 | 115 |
| Zone #3 (°C.) | 160 | 165 | 160 |
| Zone #4 (°C.) | 175 | 175 | 175 |
| Zone #5 (°C.) | 175 | 175 | 175 |
| Zone #6 (°C.) | 160 | 175 | 160 |
| Air Velocity[13] (M/min.) | 6 | 6 | 6 |
| Residence Time[14] (min.) | 2.5 | 11.0 | 2.5 |

[1])1080 is a standard industry grade description of glass fiber cloth having a given fiber size and weave and has a weight of 145 gram/yd.$^2$
[2])The weight of 128 square inch piece of cloth after resin impregnation.
[3a])The percent of resin in the treated cloth. The preferred resin is Ciba-Geigy's XU8213, which is contained in a solvent which is preferably methyl ethyl ketone.
[3b])First pass resin - BT epoxy - Varnish formulation:
  Difunctional epoxy (Ciba 9302) 47.7%
  BT blend (Mitsubishi 2060) 40.2%
  Solvent (Methyl Ethyl Ketone) 7.3%
  Yellow epoxy (Shell 1030) 4.7%
  Catylist (PHR) (Zinc Octanoate) .03%
[3c])Second pass resin - Ciba-Geigy high Tg epoxy - formulation:
  Multifunctional epoxy (Ciba 8213) 90.3%
  Solvent (Methyl Ethyl Ketone) 9.7%
  Catylist (PHR) (2-Methyl Imidazole) .13%
[4])A flow is measured by cutting eight 4" x 4" pieces of cloth after curing, and pressing them together. The amount of resin pressed out is expressed as a percent of the total resin content.
[5])The percent fully cured of the resin as measured by flaking pieces of resin off of the cured cloth and determining the percent cure. In the case of the percent cured after the second pass, since there is a mixed cure of the first and second resin, this is an estimate.
[6])The speed of the cloth as it is driven through the resin solution and the treater tower.
[7])Resin specific gravity.
[8])Resin solids is the percent of resin in the solvent. The preferred solvent is given.
[9])The level of the catalyst, which in the preferred embodiment is 2-methylimidazol in parts per 100 parts of resin.
[10])The gap between the meter rolls.
[11])The meter roll speed in meters per minute.
[12])The oven temperature of the various zones in the treater tower.
[13])The velocity of the air flowing in the treater tower.
[14])The time the impregnated cloth is in the treater tower.

As can be seen from the table above, many of the parameters are the same for both the first pass and the second pass in the present invention. Also, many of the parameters are the same for the second pass of the present invention and the prior art single pass. The main differences are in the line speed and the temperatures of the oven zones on the first pass as compared to the prior art single pass technique. The line speed is significantly slowed down, and the oven temperatures changed in some of the zones. The slowing down of the line speed results in less resin being impregnated into the cloth than at a faster line speed. This is because during the slow line speed on the vertical run of the cloth as it is coming out of the resin solution, it has more time to drain and, thus, more of the resin which has been coated onto it drains off back into the solution 14 of the resin. The temperature changes in the oven, coupled with the slower speed results in a more complete cure of the first pass resin than is achieved with the prior art single pass technique; i.e., in the prior art single pass technique, the cure for B-stage is 20–45%, whereas after the first pass of the two pass technique according to the present invention, there is about a 60% complete cure. This additional cure is desired to insure that, during the second pass of the present invention, the resin deposited on the first pass and partially cured does not redissolve, but rather remains as a base on which the second pass resin is deposited. Thus, the slower speed and higher temperatures in certain zones of the oven result in a more fully cured resin, coating essentially the fibers and significant amount of the interstices which are then covered and fully filled in during the second pass wherein the parameters are preferably about the same as the parameters for a single pass technique. Other modifications such as change in viscosity, change in percentage of resin, etc., can be used to vary the coating weight.

It should be understood that the particular table of parameters is merely illustrative and that these can be varied significantly to obtain the desired results. For example, other cloth styles could be used. Typically, these cloths can include Grade 106, 2116 or 7628, as well as others which are suitable for resin impregnation. In addition, other cloths based on quartz, s-glass or organic fibers can be used. With these other types of cloth, the parameters or conditions of coating on the two passes are modified to obtain the desired results. Also, other resins can be used, as was explained above, which would cause the conditions to be changed, all of which is well-known in the art.

Other parameters offering faster through-put are possible, including using resins with lower solids contents, higher catalyst levels and higher oven temperatures. The use of lower solids is advantageous for the first pass coating as the lower solids help to improve fiber wet out.

The concept of two pass impregnation using different resin chemistries is incorporated to address a number of different problems depending on the composition and properties of the various applied resins.

The first pass coating component, which can be impregnated with heat- and/or light-curable resins, provides well-balanced properties, such as heat dimensional stability, heat or soldering resistance, moisture resistance, electrical insulating properties and mechanical properties which are particularly useful for the construction of chip carriers and circuit boards.

In an exemplary fashion, bismaleimide-triazine (BT), as well as bismaleimide-triazine epoxy blends provide superior adhesion to glass and good resistance to conductive filament formation. These properties are important to the long term reliability of circuit boards, as well as chip carriers. In a similar way, the high glass transition temperature cyanate esters, in combination with other lower glass transition temperature cyanate esters, as well as epoxy resins normally used to modify their properties, applied onto the glass cloth as the first coating, provide superior insulation resistance to wet thermal repetitive exposure, improved adhesion to the glass and good protection to the glass resin interface. In addition, superior retention of strength is believed to be achieved at high temperatures and high moisture environments. By using such resin combinations, it is believed that the glass to resin interface remains intact and maintains its insulative properties upon various modes of thermocycling.

Subsequent to the first pass, the second pass impregnation is accomplished by utilizing specially tailored epoxy based formulations that provide compatibility to the first pass impregnation materials, good electrical characteristics, resistance to moisture and also provide exceptional adhesion to copper or other metals. The second pass coating of epoxy constitutes the majority of the volume of the composite, thus the composite material exhibits much better drilling properties than would a pure bismaleimide-triazine-epoxy glass cloth laminate. A cost reduction is also achieved from such constructions. An additional benefit of the subject invention is that when the first pass impregnation material is overcoated with the hydrophobic in nature epoxy based composition, for example (Araldite 8213), moisture induced defects such as "measles" and delamination can be prevented.

Table II below describes various resins and combinations of resins which can be used for the first pass and second pass coatings. This listing is not exhaustive, but only illustrative, and other resins and combinations can also be used. These, however, are the preferred resins and combinations.

TABLE II

| First pass resin compositions | A | B | C | D | E | F | G | H | I | J | K |
|---|---|---|---|---|---|---|---|---|---|---|---|
| Bismaleimide-Triazine, BT-2060B (70% solids) | 40.2 | 53.7 | 90.3 | | 40.2 | 37.6 | | | | | |
| Bismaleimide-Triazine, BT-2110 (70% solids) | | | | 90.7 | | | | | | | |
| Difunctional epoxy, Araldite 8011 (72% solids) | 47.7 | 36.6 | | | 37.6 | 39.7 | | | | 53.7 | 37.3 |
| Diglycidyl ether of bisphenol A, Epon 828 | | | | | | 13.3 | | | | | |
| Cresol Novolac, ECN-1280 or ECN-199 | | | | | | 10.1 | | | | | |
| Tetrafunctional epoxy (Shell 1031 - 80% solids) | 4.7 | | | | 4.7 | | | | | | 4.7 |
| Cyanate Ester, Arocy F-40S (75% solids) | | | | | | | | 40.5 | | | |
| Cyanate Ester, Arocy B-40S (75% solids) | | | | | | | 90.3 | 49.8 | 32.5 | 36.6 | 48.3 |
| Cyanate Ester, REX-379 (72% solids) | | | | | | | | | 57.8 | | |
| Solvent, Methyl Ethyl Ketone | 7.3 | 9.7 | 9.7 | 9.3 | 7.3 | 9.4 | 9.7 | 9.7 | 9.7 | 9.7 | 9.0 |
| Zinc Octanoate (18% Zinc) | 0.03 | 0.03 | 0.03 | 0.04 | 0.025 | 0.03 | 0.05 | 0.03 | 0.03 | 0.03 | 0.02 |

TABLE II-continued

| Compositions for second pass impregnation | L | M | N |
|---|---|---|---|
| Muitifunctional epoxy, Araldite 8213 (75% solids) | 90.3 | | |
| Difunctional Epoxy Araldite 9302 (72% solids) | | 87.3 | |
| Diglycidyl ether of tetrabromobisphenal A, Araldite 8011 (72% solids) | | | 47.9 |
| Cresol Novolac, Araldite 1280 | | | 39.7 |
| Hardener, Dicyandiamide | | 3.0 | 2.7 |
| Solvent, Methyl Ethyl Ketone | 9.7 | 9.7 | 9.7 |
| Catalyst, 2-Methyl Imidazole | 0.13 | 0.2 | 0.25 |

An additional application of the subject invention allows slightly modified formulations of the same resin to be used for first and second pass impregnation to gain other beneficial effects.

A base epoxy can be modified with the addition of small amounts of diluents known to give beneficial effects when present in close proximity to the glass cloth.

Examples are:

1. Silanes and the like for improved adhesion between glass and resin.
2. Ion scavengers, e.g., benzotriazole for Cu, tertiary amines for Cu and chlorides, etc., to prevent CAF formation.
3. Tougheners, e.g. for reduction of drill fracture and fiber plateback; e.g., PSF-TB from National Starch and Chemical Co., BIS-AF-PSF, also from National Starch and Chemical Co.
4. Surfactants and/or wetting agents, e.g. BYK A525 or BYK A555 or BYK W980, all from BYK Chemie, USA, for better resin wetting of the glass cloth and reduced laminate striations.

However, many of the additives which give the specific benefits above are also known to have various detrimental effects when added to the bulk composite resin. These effects include reduced glass transition temperature, degradation of electrical properties and increased bulk moisture absorption. Thus, addition of these materials only in the amounts and location where they are needed is advantageous.

Additionally, the same can be done for the second pass epoxy which may be adhered to copper (or some other metal), or organic laminate of the same or different composition:

1. Adhesion promoters such as silane block copolymers;
2. Copper adhesion promoters, e.g. N-(2-aminoethyl-3-amino propyl) trimethoxy silane or trimethoxysilylpropyl-diethylenetriami
3. Reactive coupling agents to improve adhesion to whatever the adjacent material will be, e.g., trimethoxystyryl silane.

The invention has been described as used with woven glass fiber; however, non-woven fiberglass fabric can also be used even though the interstices are not as pronounced as in woven fabric.

The invention, while particularly useful for forming chip carriers where the test requirements are stringent, nevertheless, can be used in forming circuit boards if the testing requirements and use condition indicate this additional cost is justified.

The invention is not limited to two passes or two materials. This concept is extendable to multiple passes to allow a gradual transition in properties to optimize performance as required.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of for forming a core comprising the steps of;

providing at least one sheet of material which material comprises:
   a sheet of cloth having fibers and interstices between the fibers,
   a first coating of a first selected thermosetting resin surrounding said fibers, and filling some, but not all, of said interstices,
   a second coating of a second selected thermosetting resin different from said first thermosetting resin disposed over said first coating and with said first coating essentially filling all of said interstices unfilled by said first coating of resin,
   said first coating being cured sufficiently beyond B stage cure so that it has not dissolved in the uncured resin of the second coating,
   said second coating being B stare cured,
   a transition zone between said first and second coatings that is smooth, substantially continuous with crosslinking between said first and second coatings providing an essentially continuous polymer of two layers,
   said first coating having better adhesion to cloth fibers than said second coating, and said second coating having better adhesion to metal than said first coating, and
   laminating said at least one sheet of material between two metal sheets by application of pressure and heat sufficient to essentially fully cure said resins impregnated in the cloth and form a laminate structure of said metal sheets and said sheet of material.

2. The method as defined in claim 1 further characterized by circuitizing said core to form an integrated circuit chip carrier from said core.

* * * * *